US006800232B2

(12) United States Patent
Lewis et al.

(10) Patent No.: US 6,800,232 B2
(45) Date of Patent: Oct. 5, 2004

(54) PCB SUPPORT PLATE METHOD FOR PCB VIA FILL

(75) Inventors: Charles W. Lewis, Elk Mound, WI (US); Jesse Pedigo, Chippewa Falls, WI (US); Joseph Schug, Cadott, WI (US)

(73) Assignee: TTM Advanced Circuits, Inc., Chippewa Falls, MN (US)

( * ) Notice: Subject to any disclaimer, the term of this patent is extended or adjusted under 35 U.S.C. 154(b) by 136 days.

(21) Appl. No.: 10/201,416

(22) Filed: Jul. 22, 2002

(65) Prior Publication Data

US 2003/0011098 A1 Jan. 16, 2003

Related U.S. Application Data

(63) Continuation-in-part of application No. 10/040,118, filed on Jan. 3, 2002, which is a continuation-in-part of application No. 09/752,503, filed on Dec. 28, 2000, now Pat. No. 6,506,332.
(60) Provisional application No. 60/208,456, filed on May 31, 2000.

(51) Int. Cl.[7] .............................................. B29C 65/56
(52) U.S. Cl. ........................ 264/156; 264/250; 264/267; 29/852
(58) Field of Search ................................ 264/104, 105, 264/250, 254, 259, 267, 138, 154, 155, 156; 29/852; 228/33, 52, 135, 188, 190; 427/96, 97

(56) References Cited

U.S. PATENT DOCUMENTS

| | | | |
|---|---|---|---|
| 3,601,523 A | 8/1971 | Arndt ........................ 174/68.5 |
| 4,106,187 A | 8/1978 | Smith et al. .................. 29/625 |
| 4,283,243 A | 8/1981 | Andreades et al. ......... 156/237 |
| 4,360,570 A | 11/1982 | Andreades et al. ......... 428/596 |
| 4,622,239 A | 11/1986 | Schoenthaler et al. ........ 427/96 |
| 4,700,474 A | 10/1987 | Choinski ..................... 29/846 |
| 4,777,721 A | 10/1988 | Choinski ..................... 29/846 |
| 4,783,247 A | 11/1988 | Seibel ..................... 204/181.1 |
| 4,884,337 A | 12/1989 | Choinski ..................... 29/846 |
| 4,945,313 A | 7/1990 | Brilka et al. ................. 329/349 |
| 4,964,948 A | 10/1990 | Reed ........................... 156/659 |
| 4,995,941 A | 2/1991 | Nelson et al. .............. 156/630 |
| 5,053,921 A | 10/1991 | Nelson et al. .............. 361/386 |
| 5,058,265 A | 10/1991 | Goldfarb ...................... 29/852 |
| 5,117,069 A | 5/1992 | Higgins, III ................ 174/261 |
| 5,133,120 A | * 7/1992 | Kawakami et al. ........... 29/852 |
| 5,145,691 A | 9/1992 | Kawakami et al. ......... 425/110 |
| 5,191,709 A | * 3/1993 | Kawakami et al. ........... 29/852 |
| 5,220,723 A | 6/1993 | Okada ......................... 29/830 |
| 5,274,916 A | 1/1994 | Kawabata et al. ............ 29/848 |
| 5,277,854 A | 1/1994 | Hunt ............................ 264/86 |
| 5,301,420 A | * 4/1994 | Cho et al. ..................... 29/840 |
| 5,332,439 A | 7/1994 | Watanabe et al. ........... 118/213 |
| 5,451,721 A | 9/1995 | Tsukada et al. ............. 174/261 |
| 5,456,004 A | 10/1995 | Swamy ........................ 29/852 |
| 5,471,091 A | 11/1995 | Pasch et al. ................ 257/752 |
| 5,532,516 A | 7/1996 | Pasch et al. ................ 257/752 |
| 5,540,779 A | 7/1996 | Andris et al. ............... 118/692 |
| 5,578,151 A | 11/1996 | Andris et al. ................. 156/64 |
| 5,591,353 A | 1/1997 | Davignon et al. ............ 216/18 |
| 5,591,941 A | * 1/1997 | Acocella et al. ............ 174/266 |
| 5,610,103 A | 3/1997 | Xu et al. ..................... 437/225 |
| 5,637,834 A | 6/1997 | La Bate, Jr. et al. ....... 174/264 |
| 5,637,925 A | * 6/1997 | Ludden et al. .............. 257/774 |
| 5,662,987 A | 9/1997 | Mizumoto et al. .......... 428/209 |
| 5,667,418 A | * 9/1997 | Fahlen et al. ................. 445/25 |
| 5,699,613 A | 12/1997 | Chong et al. ................. 29/852 |
| 5,707,575 A | 1/1998 | Litt et al. .................... 264/104 |
| 5,744,285 A | 4/1998 | Felten et al. ................ 430/318 |
| 5,753,976 A | 5/1998 | Harvey ....................... 257/774 |
| 5,761,803 A | 6/1998 | St. John et al. ............... 29/852 |
| 5,766,670 A | 6/1998 | Arldt et al. ..................... 427/8 |
| 5,822,856 A | 10/1998 | Bhatt et al. ................... 29/832 |
| 5,824,155 A | 10/1998 | Ha et al. ..................... 118/410 |
| 5,851,344 A | 12/1998 | Xu et al. .................. 156/379.6 |
| 5,906,042 A | 5/1999 | Lan et al. ..................... 29/852 |
| 5,925,414 A | 7/1999 | Buechele et al. ............ 427/282 |
| 5,994,779 A | 11/1999 | Gardner et al. ............. 257/773 |
| 6,000,129 A | 12/1999 | Bhatt et al. ................... 29/852 |
| 6,002,177 A | * 12/1999 | Gaynes et al. .............. 257/774 |

(List continued on next page.)

FOREIGN PATENT DOCUMENTS

| EP | 0 194 247 A2 | 9/1986 |
|----|---|---|
| EP | 0 713 358 A2 | 5/1996 |
| EP | 0 723 388 A1 | 7/1996 |
| FR | 2 684 836 | 6/1993 |
| FR | 2 714 567 | 6/1995 |

(List continued on next page.)

OTHER PUBLICATIONS

Via Etching Process, Feb. 1972.
Multilayer Printed Circuit Board Connections, Apr. 996.
Process for Forming Copper Clad Vias, Aug. 1989.

*Primary Examiner*—Angela Ortiz
(74) *Attorney, Agent, or Firm*—Greenberg Traurig, LLP; Mark Krietzman, Esq.

(57) ABSTRACT

Methods for improved electronic substrate via and thru-hole filling, particularly through the use of drilled stand-offs formed by control-depth drilling oversized non-thru-holes and the use of inserted support pillars to prevent sagging of the substrate during filling. In particular, through the use of: (1) a via fill stand off adapted for use with a substrate comprising at least two via holes to be filled, each of the via holes having a diameter of X mils, the standoff comprising at least one recess formed by control-depth drilling of holes having a diameter at least 12X mils; and (2) a via fill standoff adapted for use with a substrate comprising at least one via hole to be filled, the standoff comprising: at least one recess; and at least one support pillar positioned within the recess wherein the support pillar is not an integral part of the standoff.

10 Claims, 2 Drawing Sheets

U.S. PATENT DOCUMENTS

| | | | |
|---|---|---|---|
| 6,009,620 A | 1/2000 | Bhatt et al. | 29/852 |
| 6,015,520 A | 1/2000 | Appelt et al. | 264/104 |
| 6,079,100 A | 6/2000 | Farquhar et al. | 29/852 |
| 6,090,474 A | 7/2000 | Johansson et al. | 428/209 |
| 6,106,891 A | 8/2000 | Kulesza et al. | 427/97 |
| 6,138,350 A | 10/2000 | Bhatt et al. | 29/852 |
| 6,149,857 A | 11/2000 | McArdle et al. | 264/429 |
| 6,153,508 A | 11/2000 | Harvey | 438/622 |
| 6,184,133 B1 | 2/2001 | Iijima et al. | 438/667 |
| 6,261,501 B1 | 7/2001 | Miyagawa et al. | 264/272.15 |
| 6,276,055 B1 | 8/2001 | Bryan et al. | 29/852 |
| 6,281,448 B1 | 8/2001 | Tsukamoto | 174/260 |
| 6,282,782 B1 | 9/2001 | Biunno et al. | 29/852 |

FOREIGN PATENT DOCUMENTS

| | | |
|---|---|---|
| GB | 2 120 017 A | 11/1983 |
| GB | 2 246 912 A | 2/1992 |
| GB | 2 341 347 A | 3/2000 |
| JP | 53-010487 | 1/1978 |
| JP | 54-139065 | 10/1979 |
| JP | 58-011172 | 1/1983 |
| JP | 62-277794 | 12/1987 |
| JP | 62-287696 | 12/1987 |
| JP | 01173696 | 7/1989 |
| JP | 01236694 | 9/1989 |
| JP | 03004595 | 1/1991 |
| JP | 04186792 | 3/1992 |
| JP | 04239193 | 8/1992 |
| JP | 05275819 | 10/1993 |
| JP | 07176871 | 7/1995 |
| JP | 08172265 | 7/1996 |
| JP | 08191184 | 7/1996 |
| JP | 09083135 | 3/1997 |
| JP | 09321399 | 12/1997 |
| JP | 10065339 | 3/1998 |
| JP | 10256687 | 9/1998 |
| JP | 11054909 | 2/1999 |
| WO | WO 86/06243 | 10/1986 |

* cited by examiner

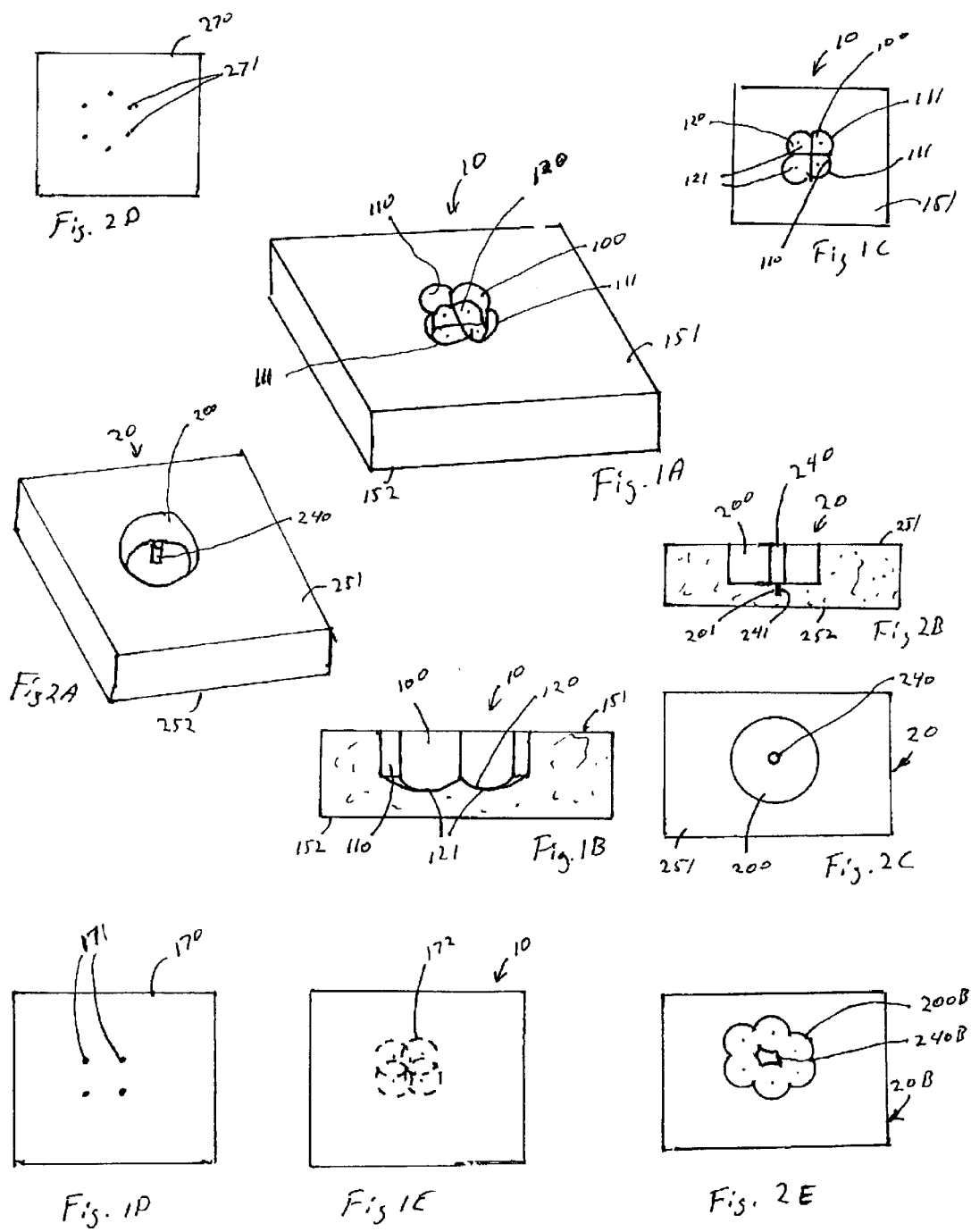

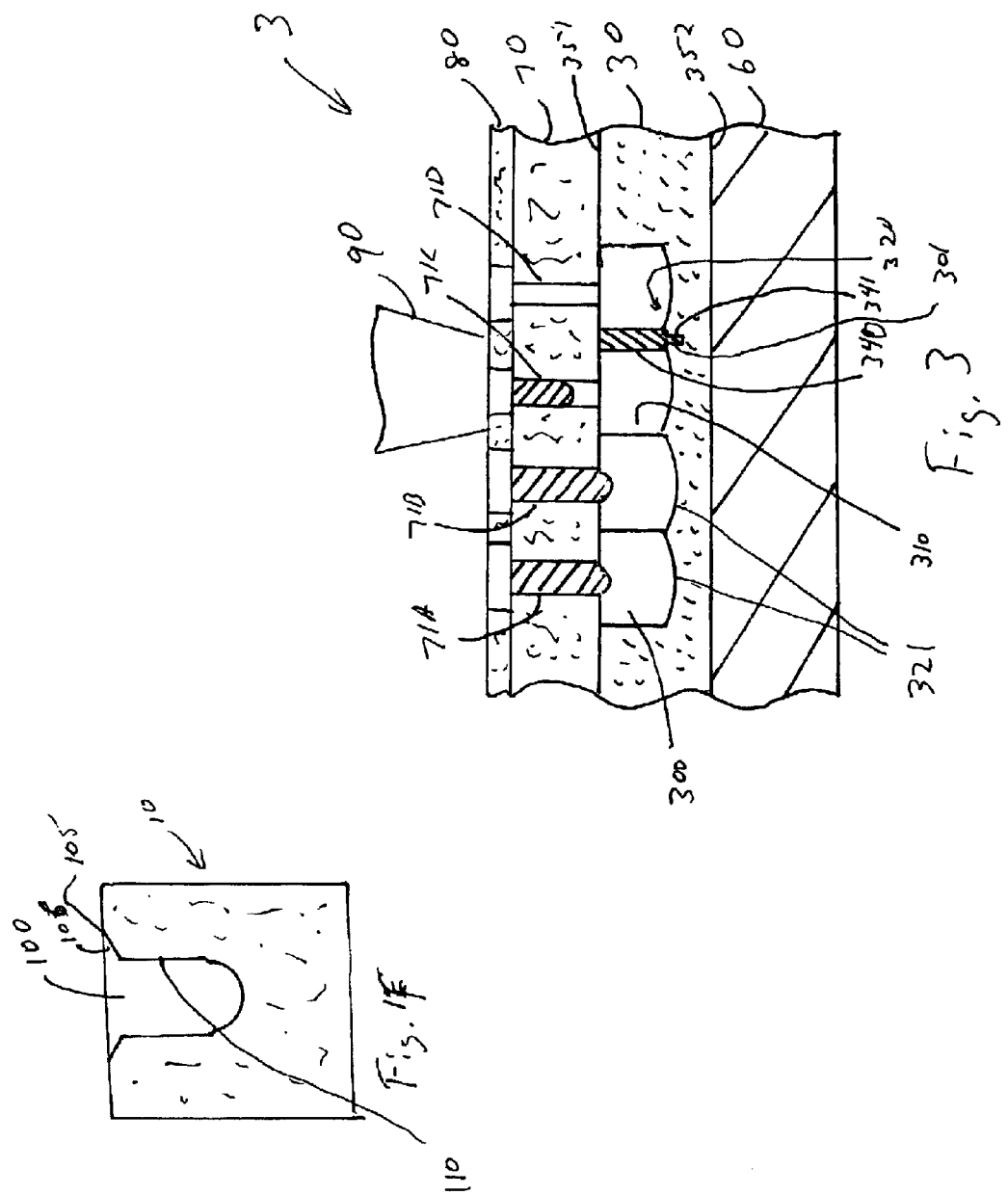

PCB SUPPORT PLATE METHOD FOR PCB VIA FILL

This is a continuation-in-part of U.S. application Ser. No. 10/040,118, filed Jan. 3, 2002, which is a continuation-in-part of U.S. application Ser. No. 09/752,503, filed Dec. 28, 2000, now U.S. Pat. No. 6,506,332, which claims the benefit of U.S. Provisional Application No. 60/208,456, filed May 31, 2000, now abandoned. A related application having a similar title and the same inventors as this application is being filed concurrently. All of the foregoing applications are herein incorporated by reference in their entireties.

FIELD OF THE INVENTION

The field of the invention is the filling of electronic substrate vias and thru-holes.

BACKGROUND OF THE INVENTION

Electronic substrates such as printed wiring boards and interconnects often comprise plated vias and thru-holes. These holes (the terms "hole" and "holes" will often be used herein to refer to both vias and thru-holes if the text is applicable to both vias and thru-holes) are often filled with a conductive paste or other fill material, typically by forcing the material into the hole from one end of the hole. For the sake of this disclosure, the end of a hole through which fill material enters the hole will be referred to as the "entrance", and the opposite end of the hole as the "exit".

When filling holes, it is important that the exits of the holes not be in contact with any surface that will later be removed from the substrate before the fill material sets or cures. Thus, if one side of the substrate is resting on a tooling plate during the fill process, there should be some separation between the tooling plate and the exit of the hole in order to prevent material drag-out as the substrate is removed from the tooling plate.

However, such separation is not always easy to achieve. Substrates tend to be relatively flexible, and the filling process often exerts a downward force on the substrate. Thus, any mechanism used to provide the required separation must be adequate to maintain that separation while pressure is applied to the substrate. Providing proper separation is made more difficult because of the need to be able to handle a large number of different hole patterns as utilizing a single stand-off for multiple hole-patterns runs the risk of having portions of the stand-off intended to support the substrate positioned directly beneath a hole to be filled.

One method of supporting a substrate during filling is to provide a tooling plate or other support having thru-holes formed in it, placing the substrate to be filled on top of such a support in a manner that the holes to be filled align with thru-holes of the support, and filling the thru-holes. Examples of such supports and their use can be found in U.S. Pat. No. 6,276,055, U.S. Pat. No. 6,282,782, and GB2246912. Unfortunately, known supports tend to be inadequate in applications where a substrate comprises a larger number of holes having minimum separation between holes such as in a grid-array arrangement. In such an application, one might simply remove an entire area of the support corresponding to the area containing the holes, but doing so would leave that area of the substrate unsupported. Moreover, even if the support comprises individual holes rather than a removed area, there is a chance that the support will distort under the pressures applied during filling with a corresponding misalignment between the thru-holes of the support and the holes of the substrate. Known supports are often relatively expensive to manufacture as well.

Possible solutions utilizing etched tooling plates are the subject of co-pending U.S. patent applications Ser. No. 10/039,942 ("Etched Hole-Fill Stand-Off") and 10/040,118 ("Hole Filling Using An Etched Hole-Fill Stand-Off"), herein incorporated by reference in their entireties. However, the solutions presented in those applications may not be suitable for all applications. Thus, there is a continuing need for improved methods and devices to facilitate hole filling.

SUMMARY OF THE INVENTION

Methods for improved electronic substrate via and thru-hole filling, particularly through the use of drilled stand-offs formed by control-depth drilling oversized non-thru-holes and the use of inserted support pillars to prevent sagging of the substrate during filling. In particular, through the use of: (1) via fill stand off adapted for use with a substrate comprising at least two via holes to be filled, each of the via holes having a diameter of X mils, the standoff comprising at least one recess formed by control-depth drilling of holes having a diameter at least Y times X mils where Y is one of 3, 9, and 12; and (2) a via fill standoff adapted for use with a substrate comprising at least one via hole to be filled, the standoff comprising: at least one recess; and at least one support pillar positioned within the recess wherein the support pillar is not an integral part of the standoff.

It is contemplated that a benefit to be obtained by the formation of stand-off recesses by controlled depth drilling of oversized holes is the retention of material in the standoff with the retained material adding to the total surface area available to support a substrate being filled.

It is contemplated that a benefit to be obtained by the formation of stand-off recesses by controlled depth drilling of oversized holes is the retention of material in the standoff with the retained material adding to the total surface area available to support a substrate being filled.

It is contemplated that a benefit to be obtained through the use of inserted support pillars is to increase the total amount of standoff surface area available to support a substrate being filled.

It is contemplated that a benefit to be obtained in forming a standoff by removing material from an otherwise solid, planar, and homogenous standoff in a manner that avoids creating thru-holes in the standoff is to provide a more rigid standoff better suited for supporting a substrate being filled.

It is contemplated that forming a stand-off having a recess where the edge of the recess is beveled may provide adequate clearance during filling of thru-holes near the edge of the recess while maximizing the ability of the stand-off to support a substrate being filled. It is also contemplated that use of such a bevel will help preventing embossing or other types of damage to the surface of the substrate being supported that contacts the stand-off, particularly when the substrate is forced against the stand-off during the filling process.

The methods and devices disclosed herein are particularly well suited for use when via and/or through hole filling is accomplished through the use of pressure fill heads as described in the following co-pending applications, each of which is incorporated herein by reference in its entirety: Ser. Nos. 09/752,503; 09/752,629; 10/039,942; 10/040,118; 10/026,135; 10/026,382; 10/026,337; and 10/026,338.

Various objects, features, aspects and advantages of the present invention will become more apparent from the following detailed description of preferred embodiments of the invention, along with the accompanying drawings in which like numerals represent like components.

BRIEF DESCRIPTION OF THE DRAWINGS

FIG. 1A is a perspective view of a drilled standoff embodying the invention.

FIG. 1B is a side view of the standoff of FIG. 1A.

FIG. 1C is a top view of the standoff of FIG. 1A.

FIG. 1D is a top view of a substrate to be filled using the standoff of FIG. 1A.

FIG. 1E is a top view of the standoff of FIG. 1A prior to drilling but showing location of holes to be drilled.

FIG. 1F is a detailed view of a recess having a beveled edge.

FIG. 2A is a perspective view of a routed standoff embodying the invention.

FIG. 2B is a side view of the standoff of FIG. 2A.

FIG. 2C is a top view of the standoff of FIG. 2A.

FIG. 2D is a top view of a substrate to be filled using the standoff of FIG. 2A.

FIG. 2E is a top view of an drilled standoff that can be used in place of the routed standoff of FIG. 2A.

FIG. 3 is a perspective view of an assembly embodying the invention.

DETAILED DESCRIPTION

In FIGS. 1A–1C, a non-air-permeable stand-off 10 comprises at least one recess 100 having non-linear sidewalls 110 formed from adjacent circular arcs 111 and a bottom 120 having depressions 121. Stand-off 10 also comprises planar upper surface 151, and planar lower surface 152.

In a preferred embodiment, recess 100 is formed by drilling holes to a controlled depth where the holes are positioned to have their center axis co-axial with the thru-holes of a substrate to be filled, and are sized to have a diameter substantially larger than the diameters of the thru-holes being filled. As an example, a substrate 170 may comprise thru-holes 171 to be filled as shown in FIG. 1D. Using the centers of the thru-holes as the center points for the standoff holes to be drilled results in a drilling pattern 172 as shown in FIG. 1E. Drilling the corresponding holes results in the standoff of FIGS. 1A–1C. As can be seen, utilizing a diameter larger than that used for the substrate thru-holes causes the drilled holes corresponding to closely spaced substrate thru-holes to overlap.

Although standoff 10 may comprise any drillable material that can act as a support for a substrate during filling, it is preferred that standoff 10 be formed from a 250 mil thick phenolic plate, and that the holes be drilled halfway through the plate to a depth of 125 mils. It is preferred that the drilled holes have a diameter twelve times that of the holes to be filled but less preferred embodiments may have drill holes that are only 3 or nine times the diameter of the holes to be filled. In a preferred embodiment where 8 mil plated holes are to be filled, the diameter of the drilled holes will be 100 mils to allow for 46 mils of clearance around the 8 mil hole to be plated. In less preferred embodiments, the amount of clearance may vary between 20 and 46 mils.

In some instances it may be desirable to provide additional clearance between thru-holes positioned near an edge of recess 100 and the upper edge 105 of recess 100 by beveling the edge of the recess so that angled surface 106 is positioned between the rest of sidewall 110 and edge 105 as shown in FIG. 1F. It is contemplated that providing a 40 degree beveled edge will (a) provide improved clearance while retaining as much material as possible in offset 10, and (b) help prevent any embossing or marring of any surface of a supported substrate contacting offset 10. Thus use of a beveled edge may also facilitate the formation of natural support pillars such as pillar 240B of FIG. 2E as such a pillar would have sufficient width on its base to prevent its removal during removal of material to form recess 100 while still maintaining adequate clearance near its upper supporting surface.

In FIGS. 2A–2C, a stand-off 20 comprises at least one recess 200, and at least one non-integral support pillar 240. Support pillar 240 in turn comprises pin 241 inserted into receiving hole 201. Stand-off 20 also comprises planar upper surface 251, and planar lower surface 252.

In a preferred embodiment, recess 200 is formed by removing, possibly routing, material from stand-off 20 so as to leave an open area beneath any holes to be filled (such as holes 271 in substrate 270 of FIG. 2D), and subsequently inserting one or more support pillars 240 adapted to help support a substrate being filled. It is contemplated that in some instances drilling holes instead of routing out an entire area may leave the equivalent of a support pillar in place such as support 240B of recess 200B of stand-off 20B of FIG. 2E. Support pillars 240 may be inserted in any location where placement of a support pillar will leave at least some clearance between the support pillar and the edge of the nearest thru-hole, but a clearance of at least 20 mils is preferred. The use of support pillars 240 provide a mechanism for preventing a substrate being filled from sagging into recess 200 during filling where removal of material to form 200 does not leave an adequate number of natural support pillars.

It is contemplated that support pillars will vary in size, shape, and composition. However, a support pillar formed as two abutting cylinders having different diameters is preferred. It in some instances it is advantageous to use a support pillar 240 having a pin 241 with a diameter of approximately 0.11 inches, and a length of approximately 0.125 to 0.25 inches. In some instances it may be advantageous for the non-pin portion of the support pillar to have a diameter between 0.125 inches and 1 inch. The height of the support pillars will generally be chosen so that the upper surface of the pillar is coplanar with surface 251 of standoff 20. The top surface of each pillar/pillar is slightly beveled or rounded to prevent embossing of the surface of any substrate being filled. It is preferred that support pillars be formed from Delrin, PVC, phenolic, or any other material that can maintain structural integrity. Support pillars of differing sizes and shapes may be utilized in a single standoff.

It is preferred that the support pillar sizes, shapes, and positions be chosen to take advantage of non-via-populated spaces of a recess. If support pillars are being used, there is less need to limit material removal to areas directly beneath through holes to be filled while forming a recess. Simplifying the material removal process may, in some instances, make up for the additional costs incurred by having to insert support pillars.

In FIG. 3, and assembly 3 includes a non-air-permeable stand-off 30, a tooling plate 60, a substrate 70, optional stencil 80, and a fill head 90. Substrate 70 comprises holes 71A–71D to be filled using fill head 90 to inject fill material. Tooling plate 60, in conjunction with standoff 30, provides support for substrate 70 during filling. Optional stencil 80 may be used to control the areas in which fill material are to be deposited and to prevent damage to substrate 70 by fill head 90 during filling. Stand-off 30 comprises features of both stand-offs 10 and 20, namely least one recess 300 having non-linear sidewalls 310 formed from adjacent circular arcs and a bottom 320 having depressions 321. Standoff 30 also comprises at least one non-integral support pillar 340 with pin 341 inserted into receiving hole 301, as well as planar upper surface 351, and planar lower surface 352.

In the preferred embodiment of FIG. 3, PWB 70 rests on top of stand-off 30 but is only coupled to stand-off 30 by pins (not shown). Similarly, stand-off 30 preferably rests on tooling plate 60, but is only coupled to tooling plate 60 by pins (not shown). In less preferred embodiments, stand-off 30 may be bonded, either temporarily or permanently to tooling plate 70, and/or may be temporarily bonded to PWB 30.

Although the figure shows assembly 1 as comprising a printed wiring board 30, any substantially planar device having holes to be filled could be used in place of printed wiring board 30 as long as the device and the stand-off 10 are adapted to be coupled to and aligned with each other so as to assure proper alignment between the pattern on stand-off 10 and the pattern on the device being filled.

Tooling plate 60 can comprise any suitable supporting surface.

It is contemplated that the methods and devices disclosed herein are particularly advantageous when used with a device such as PWB 30 wherein the artwork used to determine the locations of the various holes to be filled is available in a form that permits it to be easily used as the basis of a drilling pattern.

The standoff 30 of FIG. 3 may be formed by providing a rigid plate; forming a recess in the phenolic plate by removing material from the plate by drilling; forming one or more receiving holes in a surface of the recess; inserting a support pillar into each receiving hole so as to fill the one or more receiving holes with an equivalent number of support pillars. In instances where the standoff is to be adapted for use with a substrate to be filled comprising at least two thru-holes having a diameter of X mils, the recess may be formed by drilling holes having a diameter of at least 12X mils into the support plate, and possibly extending halfway through the plate. If a substrate comprises thru-holes of different sizes, the diameters of the drilled holes may vary accordingly. Alternately, a single diameter may be chosen for the drill holes based on the diameter of the largest or smallest through hole, on the average size of the thru-holes, or some other basis.

Thus, specific embodiments and applications of via fill stand-offs formed by over-drilling and insertion of support pillars have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method of forming a via fill standoff adapted for use with a substrate to be filled comprising:
   providing a rigid support plate;
   forming a recess in the plate by removing material from the plate by drilling or routing;
   forming one or more receiving holes in a surface of the recess;
   inserting a support pillar into each receiving hole so as to fill the one or more receiving hales with an equivalent number of support pillars; and
   providing a substrate with at least two thru-holes each having a diameter of X mils, wherein the recess is formed by drilling holes having a diameter of at least 12X mils into the support plate.

2. The method of claim 1 where the holes are drilled halfway through the rigid plate.

3. The method of claim 2 wherein the plate is a phenolic plate.

4. The method of claim 3 wherein the formed via fill standoff is subsequently used to support a plurality of substrates while at least some of the thru-holes of each of the plurality of substrates are filled.

5. The method of claim 4 wherein the substrates of the plurality of substrates are not all supported simultaneously.

6. The method of claim 5 wherein only a single substrate of the plurality of substrates is supported at any given time.

7. The method of claim 6 wherein the thru-hole patterns of each of the plurality of substrates are all identical to each other.

8. The method of claim 7 wherein the thru-holes of each of the plurality of substrates are positioned above a recess of the standoff.

9. The method of claim 8 wherein at least one column is positioned to contact a portion of each of the plurality of substrates tat is at least partially surrounded by at least three thru-holes.

10. The method of claim 8 wherein every column is positioned to contact a portion of each of the plurality of substrates that is at least partially surrounded by at least three thru-holes.

* * * * *